United States Patent

[11] 3,582,813

[72] Inventor Marion E. Hines
Weston, Mass.

[21] Appl. No. 834,812
[22] Filed June 19, 1969
[45] Patented June 1, 1971
[73] Assignee Microwave Associates, Inc.
Burlington, Mass.

[54] NEGATIVE-RESISTANCE MULTIPLE-ELEMENT COMBINER
11 Claims, 5 Drawing Figs.

[52] U.S. Cl. .......... 331/56, 328/15, 330/5, 330/34, 330/54, 330/61, 331/96, 331/107, 333/9, 333/34, 333/80
[51] Int. Cl. .......... H03b 7/14, H03f 3/10, H03f 3/60
[50] Field of Search .......... 331/56, 96, 101, 107, 107 G, 107 T; 330/5, 34, 53, 54, 56, 61 A; 333/6, 8, 9, 11, 34, 80; 325/445; 307/261; 328/15, 16, 19

[56] References Cited
UNITED STATES PATENTS

| | | | |
|---|---|---|---|
| 3,189,843 | 6/1965 | Bruck | 331/107T |
| 3,378,789 | 4/1968 | Gerlach | 331/56X |
| 3,521,194 | 7/1970 | Lowe | 331/101 |

*Primary Examiner*—Roy Lake
*Assistant Examiner*—Siegfried H. Grimm
*Attorneys*—Nicholas Prasinos and Rosen and Steinhilper

ABSTRACT: This invention relates to microwave networks in which radio frequency energy from a multiplicity of sources may be combined into a single transmission line when these sources are of the same frequency and have the same phase. A significant feature of the invention is that energy will be absorbed when the multiple sources have different frequencies or if they have different phases at the same frequency. A particular application of the network is a power combiner for an oscillator or power amplifier when multiple negative-resistance devices are needed, providing a means for avoiding or suppressing undesired oscillations which may occur at multiple frequencies or in nonsynchronous phase relationships.

PATENTED JUN 1 1971

3,582,813

SHEET 1 OF 2

Figure 1:
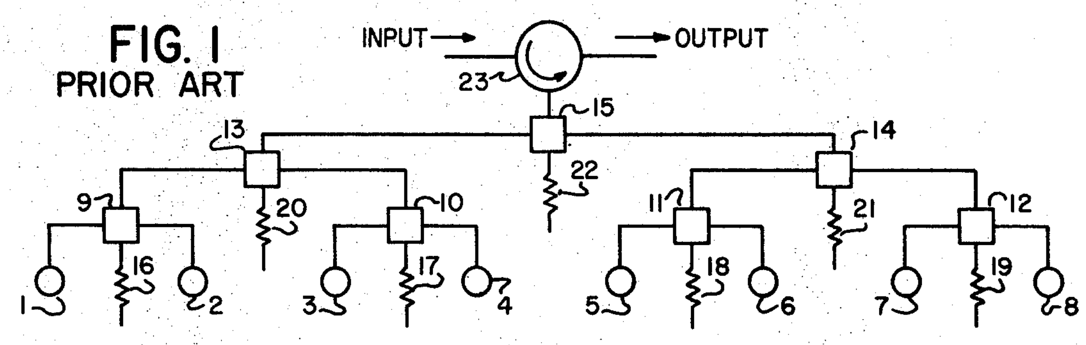
FIG. 1 PRIOR ART

MARION E. HINES
INVENTOR
BY Nicholas Orossino [signature]
ATTORNEYS

MARION E. HINES
INVENTOR

BY Nicholas Pisarenos
Rosen + Steinhilper
ATTORNEYS

NEGATIVE-RESISTANCE MULTIPLE-ELEMENT COMBINER

BACKGROUND OF THE INVENTION

The field of this invention is microwave generation, amplification and conversion of high power microwave energy utilizing in combination a multiplicity of electron discharge elements which provide negative resistance at high frequency at two terminals capable of individually generating, amplifying, and converting high frequency oscillations over particular ranges of frequencies when suitably biased by a battery or other source of power.

One suitable semiconductor device for such combination is the Gunn diode which consists of a wafer of gallium arsenide biased with a DC source. (J. B. Gunn, "Microwave Oscillations of Current in III—V Semiconductors," Solid State Comm., Vol. 1, pp. 87—91, Sept. 1963.) Another suitable element is the Read avalanche diode or other PN junction diode biased into reverse avalanche discharge. This is a semiconductor PN junction first described by Read. (W. T. Read, "A Proposed High Frequency Negative-Resistance Diode," Bell Systems Tech. Journal, pp. 401—466, Mar. 1968.) Still another suitable element is a Gallium Arsenide device operating in the "LSA" mode as described by Copeland. (J. A. Copeland, "L.S.A. Oscillator Diode Theory," Journal of Applied Physics, pp. 3096,3101, July 1967.) Still other forms might include PNPN-type semiconductor diodes, tunnel diodes, varactor diodes, Schottky Barrier diodes, and the like. Even transistor-type structures may also be used if these can be arranged in an elementary form which provides a negative resistance at high frequency at two terminals. This invention is not primarily concerned with the internal structure of these elementary devices but rather with the circuits and structures in which they are placed. The invention applies to the application of any type of such oscillations or negative resistance discharge device, including those not mentioned above or new types which are yet to be discovered.

The above devices when used at microwave frequencies are generally low power devices and the extension to higher powers, substantially greater than one watt average power, requires multiple diode elements so separated that special mode suppression techniques must be used. This multiple-mode problem arises because of the well-known network principle that a low-loss network containing "*n*" capacitance elements (diodes) and "*n*" inductance elements will have at least "*n*" resonant frequencies. Distributed networks of most types containing "*n*" negative-resistance diode elements might be capable of oscillating in any of "*n*" modes. Usually, also, an output line coupled to such a network may not couple effectively to all of these modes so that some modes will be high Q resonances, tending to favor oscillation in the uncoupled ones.

Previous techniques combining multiple individual elements include several basic approaches as follows:

1. providing a strong RF drive in an amplifier which will cause a very strong reduction in the negative-resistance effects for other frequencies, tending to suppress undesired oscillating modes;
2. tuning out undesired modes into frequency bands not favorable for oscillation, leaving the desired mode only in the band of interest;
3. introducing resistive loading in a specially symmetric network so that this loading is effective for all but one mode, leaving this symmetric mode unattenuated for use as the proper amplifier mode.

These techniques are all useful and have been applied in the past in various ways. The first is a generally useful principle. It is always applicable to some degree in any saturated negative-resistance device. For example, complex oscillator circuits commonly operate in only one mode at any one time, strong oscillations in any one mode tending to prevent buildup of oscillations in another. In this case, modes may jump from one to another, and various ones may be started and maintained depending upon initial conditions. The multicavity magnetron is a notorious example. Another is the amplitron tube.

Mode detuning has also been used to reduce moding effects in multicavity magnetrons. This is done either by "strapping" or through a special form of resonator as in the "rising-sun" magnetron and the coaxial magnetron. Two recent patent applications, one by M. E. Hines on "Integrated Multiple-Element Microwave Generator," application number 704,817 filed 2/12/68, and another by Hines, Collinet, and White, "-Circuits for Generating and/or Amplifying Microwave Energy," application number 785,322 filed 12/20/68, show how the principle can be used with solid-state electron discharge elements. In the case of solid-state devices, it is directly applicable to high-Q oscillators and narrow band or tunable amplifiers. It is also useful for travelling-wave high power amplifiers of low gain per element, but it does not at the present time appear to be a promising approach for module amplifiers of the type being considered in this application when a gain of 10 db. or more is needed in a single module.

The third principle, that of special symmetry with resistive loading, is discussed in two forms here. The first form is already known; it is the "hybrid-tree" oscillator described by Fukui. (H. Fukui, "A Multiple Silicon-Avalanche Diode Oscillator," International Electron Device Meeting, Washington, D. C., Oct. 1966.) This is shown in FIG. 1 and labeled "prior art." There are eight simple reflection amplifiers, 1 through 8, here but only one circulator 23. A tree of symmetrical magic-tee hybrids, 9 through 15, joins these in a symmetrical way, coupling all elements finally to the circular 23, through a single line. The antisymmetrical arms of each hybrid, 9 through 15, must be resistively loaded by terminating 16 through 22 respectively. It is easy to understand how the multiple modes of this structure can arise and how they are suppressed by these resistive terminations. For example, if two of the amplifiers 1 and 2 were to begin to oscillate in opposite phase, one from the other, and if there were no load on the fourth arm 16 of the hybrid, then the power of each would be reflected back and not be coupled to the output. This would induce an internal high Q resonance involving these two diodes and a high level oscillation would build up. However, resistively loading all of the fourth arms 16 through 22 on all of the hybrids 9 through 15 respectively, matches the diode mounts for all possible phase relationships among the various amplifiers 1 through 8. The only mode coupled to the output line is the "unison " mode where all the amplifiers 1 through 8 may be driven in phase. All other modes are resistively loaded at the hybrids 9 through 15.

Using modern microwave integrated circuit techniques, such a tree of hybrids, and their resistive terminations can be printed as a single network on a ceramic board. Theoretically, the technique can be expanded to 16, 32, or 64, etc. elements as desired but there are certain practical limits to such extension. The most serious one is circuit loss. As the numbers increase, the total microstrip line length increases and also the number of hybrids through which each signal must pass. A second problem will be bandwidth. Microstrip hybrids have a limited bandwidth and the signal must pass through each one twice. Thus, for 16 elements, four stages of hybrids are involved and the signal will be band-limited thereby, as in passage through eight hybrids in tandem, counting both directions. Probably the optimum number of elements for such an integrated module is eight or 16, because of these limitations.

SUMMARY OF THE INVENTION

An alternative, according to the present invention, for avoiding these limitations is the sectored radial-line module. In this structure, a special form of radial line with coaxial center feed has ten or more diodes symmetrically distributed across the line around the outer circumference. The radial line acts as a low-loss transformer to lower the impedance of the coaxial line from 50 ohms to a small fraction of 50 ohms, suitable for a plurality of diodes in parallel. The end of the line is closed as an RF short beyond the diodes to provide the inductive loop for suitable resonance.

One important new feature of this invention is a sectored sole plate for the radial line. Deep slots in the radial direction are cut into this plate extending from the center hole to beyond the diodes. These slots are filled with a resistively lossy material. These slots comprising a radial zone separate the radial line into 10 parallel radial-line sectors, although more may be utilized.

For unison mode, with purely radial propagation and with complete symmetry, no RF voltage appears across the slots and the lossy material will not be seen by the RF wave. However, for *all* of the other modes, involving phase variations around the circumference, and from diode to diode, there must be propagation across the slots, causing RF voltages across the slots and strong power absorption. These modes, therefore, can be suppressed, or reduced to low levels, such that the device can operate as a amplifier or an oscillator when driven at the center. Driven through a circulator, the device will provide a complete amplifier.

A major object of this invention is to provide useful circuits and mounting structures for multiple elements of the electron discharge-type so that they will act in unison to provide a single high frequency signal coherently in a combined oscillation, and with a power output capability substantially equivalent to the sum of the output capabilities of the many electron discharge elements used.

Another object of the invention is to provide a mounting structure for a plurality of electron discharge elements which can conduct away the excess heat energy produced by a multiplicity of elementary devices.

DESCRIPTION OF THE INVENTION

Figure 2A:
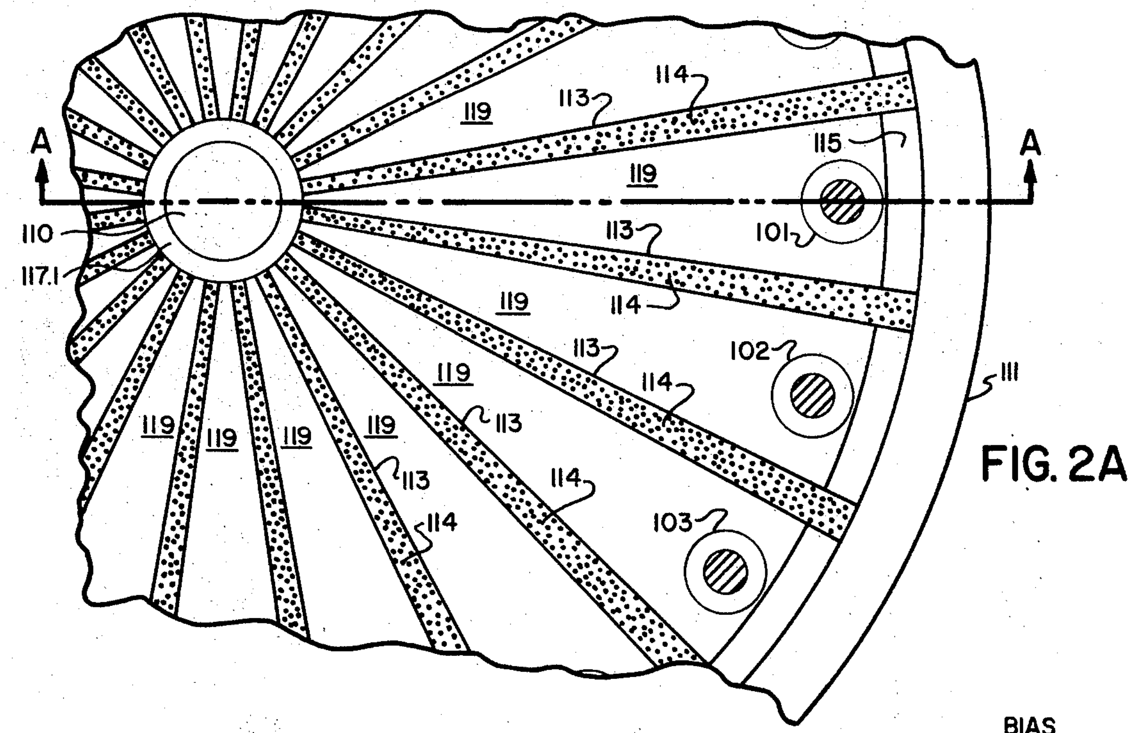
Figure 2B:
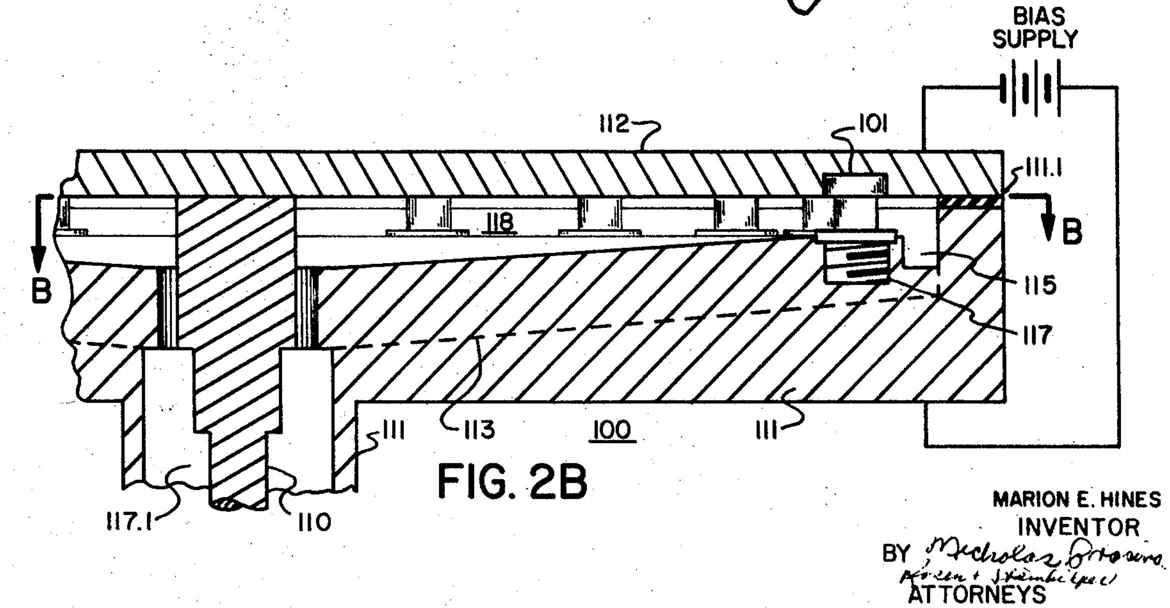
Figure 3A:
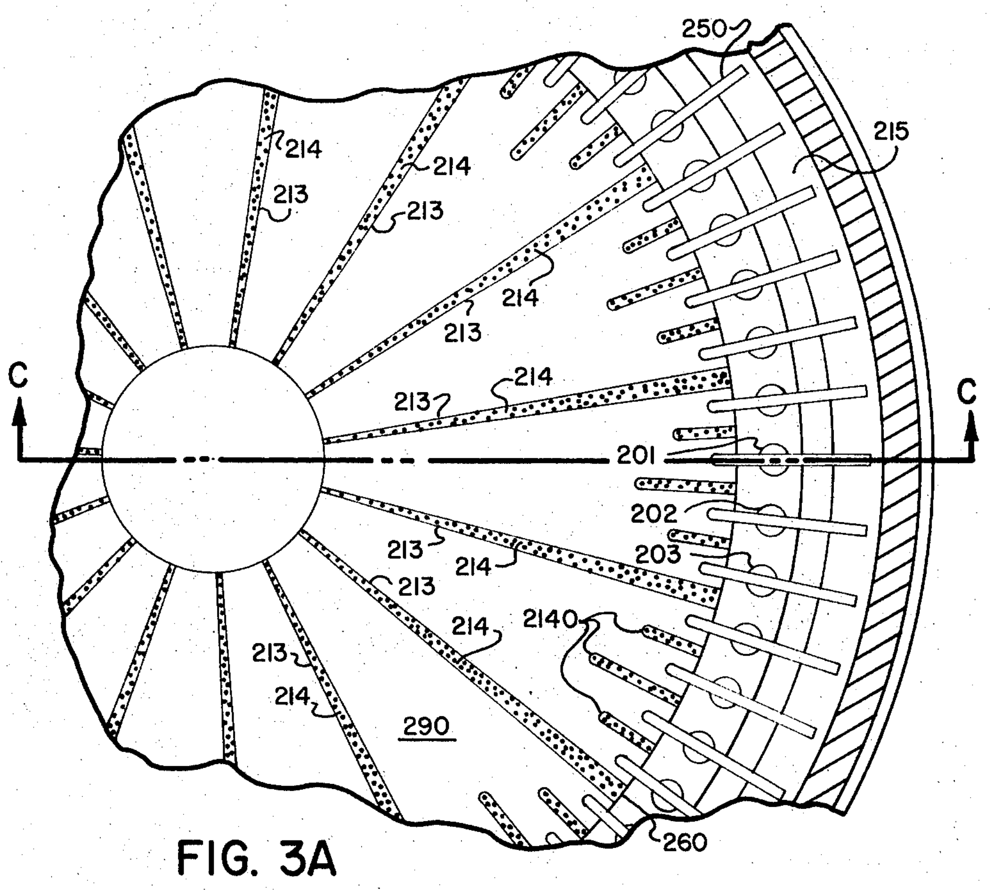
Figure 3B:
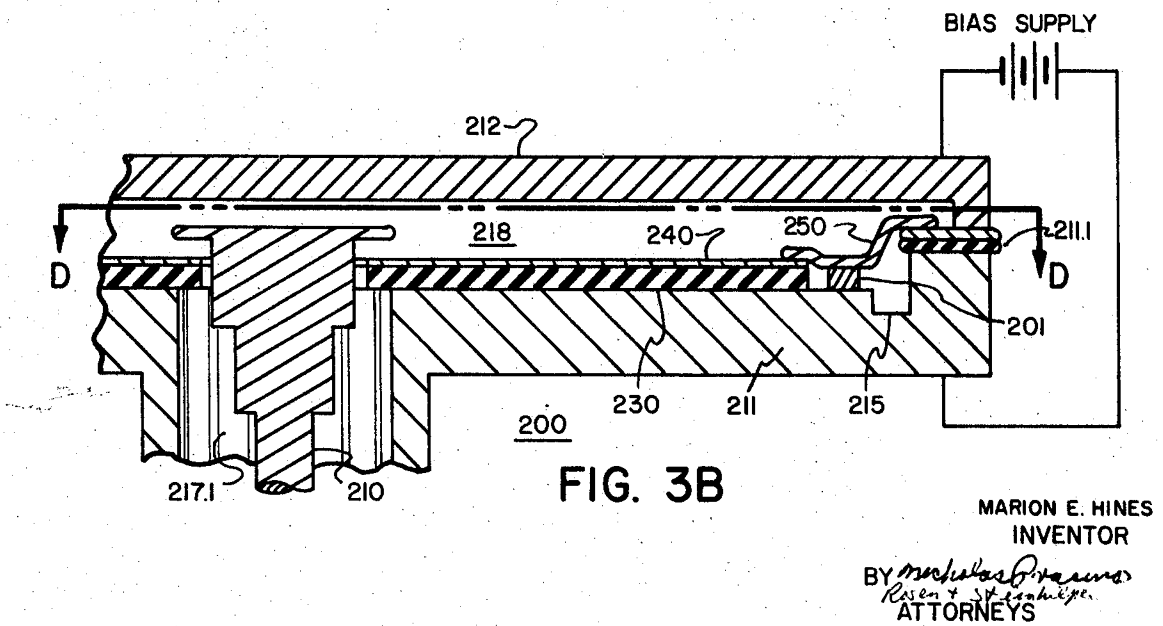

Exemplary embodiments of the invention, and methods to make them, are described with reference to the accompanying drawings, in which:

FIG. 1 schematically shows a prior art hybrid tree network for combining multiple element electron discharge devices;

FIG. 2A schematically illustrates a plan cutaway view with cover plate removed of one embodiment of this invention wherein the electron discharge devices are packaged diodes in a sectored radial line;

FIG. 2B schematically illustrates a cross-sectional view of FIG. 2A taken along line A–A;

FIG. 3A schematically illustrates a plan cutaway view with cover plate removed of an integrated version of this invention wherein the diodes are generally in passivated chip form and the sectored radial line is in ceramic microstrip form;

FIG. 3B schematically illustrates a cross-sectional view of FIG. 3A taken along line C–C.

FIGS. 2A and 2B show a cutaway of a structural embodiment (not to scale) of one species of this invention. FIG. 2A is a plan view of FIG. 2B with a cross section taken along B–B in order to show the embodiment of FIG. 2A with the cover plate 112 removed. This structure numbered generally 100 is a special form of radial line in the form of a plate 111 with coaxial center feed 110. The plate 111 may be any metal electrical conductor such as copper or aluminum, and in this embodiment it is copper. Ten or more diodes 101, 102, 103, etc. are symmetrically distributed across a variable impedance transmission line generally denoted 118, which varies from high impedance to low impedance radially from its center. The diodes 101, 102, 103, etc. in this embodiment are each in a form of stud package familiar to the microwave semiconductor art and each is threaded at one electrode in a tapped hole 117 shown in FIG. 2B, although any other diode package may be utilized and fastened by other fastening means known to the art. Slots 113 are cut in the radial direction into the plate 111 extending from the center hole 117.1 to beyond the diodes 101, 102, 103, etc. These slots 113 are filled with resistive lossy material 114 such as for example carbon forming radial line zones on the radial line plate. This separates the radial line plate 111 into 10 or more radially extending line sectors 119 in a parallel electrical connection by zones 113 to the depth of the slots 113, preferably for a depth greater than the penetration of microwave energy. The slots 113 may be filled with other lossy material such as "Polyiron." The end of the nonuniform impedance transmission line 118 is closed as an RF short beyond the diodes to provide the inductive loop 115 which in combination with the capacitance of the diodes 101, 102, 103, etc. provides for a suitable resonance. The inner radial line 119 acts as a low-loss transformer to lower the impedance of the coaxial line, generally denoted 110, from 50 ohms to a small fraction of 50 ohms, suitable for ten or more diodes in parallel. Typically, as an example but not intending to limit this invention, at saturation, these diodes 101, 102, 103, etc. spaced symmetrically and circumferentially on plate 111, are expected to have an operating negative conductance of −0.05 ohms (−20 ohms) each, and as an amplifier should be loaded by an equivalent of substantially +10 ohms for each diode. Ten diodes in parallel imply a total line impedance of substantially 1 ohm. For a structure about 5 inches in circumference, the spacing between the radial-line plates must be reduced to substanially 0.020 inch or 20 mils through tapering of this line, or in steps by a suitable multistep impedance transformer 119. A cover plate 112 shown in FIG. 2B electrically separated from plate 111 by dielectric member 111.1 but making the electrical contact with center conductor 110 completes the device and forms a nonuniform impedance transmission line 118. The space 117.1 not occupied by center conductor 110; and also the space between outer conductor plate 111 and cover plate 112 is air dielectric although any suitable dielectric material may be used.

For unison mode operation, with purely radial propagation and with complete symmetry, no RF voltage appears across the slots 113 there being no potential difference; therefore, the lossy material 114 in the slots 113 will not see the RF wave. However, for all of the other modes, involving phase variations around the circumference, and from diode to diode, there normally will be wave propagation across the slots 113, causing RF voltages across the slots 113 and strong power absorption by the lossy material 114 in the slots 113. These modes, therefore, are suppressed or reduced to low levels such that the device operates as an amplifier when driven at the center by an input wave of adequate power to suppress such oscillations by the principle numbered (2) under "-Background" above. Driven through a circulator with the input and output lines and the device connected to the circulator, the device will provide a power amplifier. To do so, techniques now well known in the field can be utilized. For example, a signal generated elsewhere may be injected through a ferrite circulator (not shown) into the input-output line. This signal wave can be caused to be reflected from the network of this invention along the line with power greater than that applied. This amplified reflected wave can be separated externally in a known manner by the use of the ferrite circulator.

Alternatively this device may also be used as a frequency converter by replacing the circulator with a branch-type wave filter in order to apply input signals at one frequency and extract output signals at another frequency.

An integrated version of the invention is schematically illustrated in FIGS. 3A and 3B. The basic principles of operation and application are similar to the previously described embodiment; however, there are structural variations. Again a structure generally denoted 200 is a special form of radial line in the form of a metallized ceramic microstrip 230. The ceramic may be alumina or beryllia and the metallization may be copper, silver, gold, aluminum, nickel, etc. and is fabricated on the ceramic board utilizing microwave integrated circuit techniques generally known in the art, such as multiple vapor deposition with subsequent sintering and firing techniques. (See "Electronics," June 10, 1968, pp. 100-—109-"Microwave IC's-New Problems, but Newer Solutions," W. J. Moroney.)

Instead of slots in the sole plate, the metallization 240 on the top surface of the ceramic 230 is sectored by masking with photoresist or other suitable masking material in a sectored pattern and etching away the unwanted metallization, utilizing techniques well known in the semiconductor art; then the areas 213 extending from the center conductor 210 to the circumference 260 are deposited or otherwise covered with a resistively lossy material 214 such as carbon or a thin film of high resistance metal such as nichrome or tantalum. Similarly, additional lossy resistive material 2140 is fabricated on the ceramic surface 230 from the circumference 260 extending radially for some distance toward the centerline 210, on the ceramic surface 230. These additional areas 2140 of lossy material provide for a greater density of absorptive material near the circumference 260 where the spacing between sectors diverges rapidly and hence increases the absorption efficiency of spurious modes. The fabricated sectored microstrip line generally denoted as 290 is rigidly supported on sole plate 211. A plurality of passivated semiconductor diode chips 201, 202, 203, etc. are symmetrically distributed across the sectored nonuniform impedance transmission line generally denoted as 218. These diode chips may be of the beam lead type well known in the semiconductor industry, plain diode chips of the planar or mesa variety with an ohmic contact for the active region, or microwave pill diodes generally packaged in ceramic or glass packages, and are generally available from microwave semiconductor manufacturers such as Microwave Associates, Inc. They are firmly bonded to the sole plate 211 forming an electrical and thermal connection on their base region whereas the top region is electrically connected to the sectored line 290 and the cover plate 212 via a metal strap or mesh connection 250. One or more diodes 201, 202, 203, etc. may be connected to each sector 290. The remainder of the structure is similar to that described in FIGS. 2A and 2B, with inner radial line 210, corresponding to inner radial line 110 and cover plate 212 corresponding to cover plate 112 of FIG. 2B. Again, a symmetrical radial wave will induce no RF voltage between sectors and no loss will be introduced. However, for all other modes, propagation across the sectors must occur, inducing losses which suppress these modes. This version of the device has a particular advantage in that the parasitic package capacitance and some of the parasitic inductance effects will be greatly reduced. This will allow a marked increase in the bandwidth of the amplifier in excess of 40 percent. In one version of this device, approximately 40 semiconductor chips will be needed.

The embodiments of the invention which have been illustrated and described herein are but a few illustrations of the invention. Other alternative circuit arrangements may be made within the scope of this invention. For example, the resistively lossy material may be laid down in a random pattern radially on the outer conductor. Or the diodes may be symmetrically placed on a cylindric surface properly sectored and properly stepped to form an impedance transformer.

No attempt has been made to illustrate all possible embodiments of the invention, but rather only to illustrate its principle and the best manner presently known to practice it. Therefore, while certain specific embodiments have been described as illustrative of the invention, such other forms as would occur to one skilled in this art on a reading of the foregoing specification are also within the spirit and scope of the invention.

What I claim is:

1. A high frequency electrical network for coupling a primary electromagnetic wave transmission path to a multiplicity of electron discharge devices comprising:
   a. means providing a primary electromagnetic wave transmission line path;
   b. means providing a second wave transmission line path coupled to said primary path symmetrically disposed about the longitudinal axis thereof;
   c. means radially dividing said second path into sectors;
   d. at least one electron discharge device in each sector coupled across said second path;
   e. said dividing means comprising electromagnetic wave absorbing material disposed between said sectors for absorbing electromagnetic waves traveling from one of said sectors to another.

2. A high frequency electrical network as recited in claim 1 wherein the means providing a second wave transmission line path coupled to said first path extend transversely therefrom about the longitudinal axis thereof and is in the shape of a circular plane.

3. A high frequency electrical network as recited in claim 1 wherein the means providing a second wave transmission line path coupled to said first path and extending transversely therefrom about the longitudinal axis thereof has a variable impedance which varies from high to low in a radial direction from said axis.

4. A high frequency electrical network as recited in claim 1 wherein said sectors are equal and symmetrical.

5. A high frequency electrical network as recited in claim 1 wherein the electron discharge devices are equally spaced circumferentially about said axis.

6. A high frequency electrical network as recited in claim 1 wherein the means radially dividing said second path into sectors comprise slots forming radial zones extending radially from said axis, said slots having disposed therein electromagnetic wave absorbing material.

7. A high frequency electrical network as recited in claim 1 wherein said second wave transmission line path is formed of dielectric material with deposited metallic conductive sectors separated by zones of deposited resistive material.

8. A high frequency amplifier in accordance with claim 1 further comprising means for separating the input wave from the amplified and reflected wave and wherein the electron discharge devices are negative-resistance elements.

9. A high frequency oscillator in accordance with claim 1, wherein the electric discharge devices are negative-resistance elements.

10. An electric wave frequency converter as recited in claim 1, further comprising means for separating input and output frequencies, in which the electron discharge elements are nonlinear-impedance diodes.

11. A high frequency electrical network for coupling a primary electromagnetic wave transmission path to a multiplicity of electron discharge devices substantially equal and symmetrical, comprising:
   a. means providing a primary electromagnetic wave transmission line path;
   b. a section of variable impedance transmission line symmetrically disposed about the longitudinal axis of said primary electromagnetic wave transmission path means;
   c. radial zones dividing said variable impedance transmission line into multiple radially extending sectors equally disposed about said axis;
   d. first coupling means between said primary electromagnetic wave transmission line path means and said variable impedance transmission line electrically coupling said paths, said primary electromagnetic wave transmission path means and said first coupling means being centered upon and symmetrically disposed about said axis;
   e. a multiplicity of electron discharge devices symmetrically and equally disposed about said axis along a circumferential line whose center is on said axis;
   f. multiple secondary coupling means between said variable impedance transmission line and said electron discharge devices electrically coupling said electron discharge devices to said variable impedance transmission line, said secondary coupling means being symmetrically and equally disposed about said axis;
   g. and high frequency electromagnetic wave energy-absorbing material disposed in said radial zones to selectively absorb high frequency electromagnetic waves traveling in said variable impedance transmission line, those electromagnetic waves which travel with uniform and symmetrical phase along radial vectors lying in said set of radially extending sectors not being absorbed whereas those electromagnetic waves traveling in other directions being attenuated.